United States Patent [19]

Rauscher

[11] Patent Number: 4,518,931
[45] Date of Patent: May 21, 1985

[54] TRANSISTOR OSCILLATOR/FREQUENCY DOUBLER WITH OPTIMIZED HARMONIC FEEDBACK

[76] Inventor: Christen Rauscher, 3101 Crafford Dr., Ft. Washington, Md. 20744

[21] Appl. No.: 491,841

[22] Filed: May 5, 1983

[51] Int. Cl.³ .......................... H03B 5/18; H03B 1/04
[52] U.S. Cl. ....................................... 331/76; 331/99; 331/105; 331/107 SL; 331/117 D
[58] Field of Search .................. 331/76, 99, 100, 105, 331/107 SL, 117 FE, 117 D, 117 R

[56] References Cited

U.S. PATENT DOCUMENTS

| | | | |
|---|---|---|---|
| 3,680,002 | 7/1972 | Quine | 331/99 |
| 3,921,056 | 11/1975 | Mahoney | 331/99 X |
| 4,149,127 | 4/1979 | Murakami et al. | 331/99 X |
| 4,199,734 | 4/1980 | Dressen | 331/76 |
| 4,310,809 | 1/1982 | Buck et al. | 331/117 D |
| 4,321,560 | 3/1982 | Nishikawa et al. | 331/99 |
| 4,357,582 | 11/1982 | Ishihara et al. | 331/117 D X |

FOREIGN PATENT DOCUMENTS 25544  2/1977  Japan ............................ 331/107 SL

OTHER PUBLICATIONS

Schellenberg, et al., entitled "A 69 GHz FET Oscillator", *IEEE MTT-S Symposium*, pp. 328-330, 1981.
Stancliff, et al., entitled, "Harmonic Load-Pull", pp. 185-187, 1979.
Gupta, et al., entitled, "Performance and Design of Microwave FET Harmonic Generators", *IEEE Transactions on Microwave Theory and Techniques*, vol. MTT-29, No. 3, Mar., 81, (pp. 261-263).
Willing, et al., *IEEE Transactions on Microwave Theory and Techniques*, vol. MTT-26, No. 12, Dec. 1978, pp. 1017-1023, "A Technique for Predicting Large-Signal Performance of a GaAs MESFET".
Rauscher, et al., *IEEE Transactions, on Microwave Theory and Techniques*, vol. MIT-27, No. 10, Oct. 1979, pp. 834-840, "Simulation of Nonlinear Microwave FET Performance Using A Quasi-Static Model".

*Primary Examiner*—Eugene R. LaRoche
*Assistant Examiner*—D. C. Mis
*Attorney, Agent, or Firm*—Robert F. Beers; William T. Ellis

[57] ABSTRACT

A microwave transistor oscillator/doubler comprising a Field-Effect Transistor with Terminals G, D and S in combination with a coupling network connected to the terminals G, D and S and composed of microstrip lines with lengths equal to a quarter wavelength at the second harmonic of a fundamental frequency. The doubler further comprises a bias circuit for supplying appropriate voltages to the FET terminals, and an impedance coupler for coupling from the FET D-S terminals to a waveguide load. The coupling network optimizes feedback at the second harmonic between the D-S and G-S ports of the FET to prevent destructive harmonic feedback interaction with the desired signal while providing optimum conditions for feedback at the fundamental frequency. The bias circuit is connected to the coupling network and includes a second network of transmission line elements of lengths equal to a quarter wavelength at the fundamental in order to prevent dissipation of the fundamental frequency therein.

26 Claims, 4 Drawing Figures

TRANSISTOR OSCILLATOR/FREQUENCY DOUBLER WITH OPTIMIZED HARMONIC FEEDBACK

BACKGROUND OF THE INVENTION

The present invention relates generally to the field of harmonic frequency generation/frequency multiplication, and more particularly to oscillator/doublers for generating the second harmonic frequency.

Due to the increased utilization of the millimeter-wave frequency range, there is a significant need for millimeter-wave generation devices for generating RF power at these frequencies. There are a variety of advantages such as ease of fabrication and packaging which accrue if the aforesaid millimeter-wave generating device can be formed in the solid-state domain. In this regard, there are already a number of transistors which are capable of fundamental frequency oscillation up through at least 40 GHz. An example of such a transistor is the GaAs FET utilizing sub-half-micron gate lengths. Moreover, the millimeter frequency generation range for such transistors can be appreciably extended even further by exploiting the nonlinear properties of the device in order to obtain harmonics of the fundamental, i.e. frequency multiplication. Such frequency multiplication is used to generate microwave and millimeter wave power at frequencies at which it is not practical to achieve fundamental frequency oscillation due to a lack of transistor gain. It has been found that the use of the frequency multiplication technique is especially advantageous for obtaining power at the second harmonic frequency because limitations imposed by parasitic effects common at higher frequencies are avoided.

The present invention sets forth a solid-state design for exploiting the frequency multiplication technique. The basic circuit to be considered in the present design consists of a transistor and a coupling network. Such a transistor coupling network combination provides oscillation at the fundamental frequency $f_o$ as well as a significant signal power component at the second harmonic frequency at $2f_o$. Thus, the circuit functions both as a fundamental frequency oscillator and a harmonic frequency generator. Signal power is then extracted at the harmonic frequency only.

In order to achieve the maximum power conversion from DC to RF, optimum matching conditions are required for the input and the output of the transistor. A number of references have been directed to the problem of achieving maximum efficiency of power generation at the second harmonic frequency. By way of example, the paper "Performance and Design of Microwave FET Harmonic Generators" by M. S. Gupta, R. W. Laton, and T. T. Lee, IEEE Transactions On Microwave Theory And Techniques, Vol. MTT-29, No. 3, March 1981, sets forth a design for testing the frequency doubling characteristic of a GaAs MESFET with the input and output frequencies being 4 and 8 GHz, respectively. The input and output ports of the FET are matched and tuned at their respective frequencies by microstrip stubs. In addition, external coaxial stub tuners are used to optimize the doubler performance by varying the impedances presented to the device at various harmonic frequencies. The reference "Harmonic Load Pull" by R. B. Stancliff and D. D. Poulin, 1979 IEEE MTT-s International Microwave Symposium Digest, pp. 185–187, April 1979, sets forth another technique for independently tuning an oscillator signal and the second harmonic therefrom. In one embodiment, the tuning at the fundamental and the second harmonic is achieved by a slide screw tuner. However, neither of the above-cited references achieved maximum DC to RF power conversion efficiency.

OBJECTS OF THE INVENTION

It is an object of the present invention to significantly improve the DC to RF power conversion efficiency of microwave transistor harmonic oscillators.

It is a further object of the present invention to optimally match the input and the output of an oscillator transistor at both its fundamental and its second harmonic while implementing optimum feedback conditions independently at the fundamental and its second harmonic.

It is yet a further object of the present invention to fully exploit transistor harmonic power generation by providing an oscillator coupling circuit with enough degrees of freedom to allow the independent choice of loading conditions at the fundamental and the second harmonic frequency both at the input and the output, independent of the choice of feedback conditions at those frequencies.

It is still a further object of the present invention to bias the transistor and establish fundamental frequency feedback to obtain maximum generation of the second harmonic frequency while simultaneously insuring that the maximum harmonic power is also delivered to the load.

It is yet a further object of the present invention to prevent power at the fundamental frequency from being dissipated in the load or in the biasing circuitry.

It is yet a further object of the present invention to specifically exercise control over the transistor feedback at the harmonic frequency and, in one embodiment to prevent such feedback.

Other objects, advantages, and novel features of the present invention will become apparent from the detailed description of the invention, which follows the summary.

SUMMARY OF THE INVENTION

Briefly, the present invention sets forth an oscillator circuit for generating power at a desired harmonic frequency comprising a transistor with terminals B, C, and E, a coupling network connected to the B, C and E terminals, a bias circuit for supplying appropriate voltages to the transistor terminals to effect biasing thereof, and circuitry for coupling the desired harmonic from the C-E port to a load. The coupling network includes a first circuit for providing feedback at a fundamental frequency $f_o$ from the output port C-E to the input port B-E in order to make the transistor oscillate at the fundamental frequency $f_o$. The coupling network further includes a second circuit which operates in conjunction with the first circuit for controlling the coupling of the desired harmonic of frequency $f_o$ between port C-E and port B-E.

In one embodiment, the second circuit includes means for providing approximately infinite impedance between the transistor terminals C and B at the desired harmonic frequency of $f_o$. The first circuit of the coupling network may be implemented by a pair of first and second coupled transmission line elements for providing feedback at the fundamental frequency $f_o$, with each of the first and second line elements being a quarter wavelength long at the desired harmonic frequency and each having a first and second ends. The first transmission line element is connected at its first end to the C-E port while the second transmission line element is connected at its first end to the B-E port, with the second ends of these lines terminated appropriately. The second circuit of the coupling network may comprise a third and fourth transmission line elements, each a quarter wavelength long at the desired harmonic frequency and each having a first and second ends. The third transmission line element may be connected at its first end to the second end of the first transmission line element and with the second end of the third transmission line element being an open circuit. The fourth transmission line element may be connected at its first end to the second end of the second transmission line element and with the second end of the fourth transmission line element being an open circuit.

The bias circuit may be connected across the second ends of the first and second transmission line elements. This bias circuit may include means for effecting an open circuit driving point impedance at the fundamental frequency $f_o$ relative to its terminals connected to the second ends of the first and second transmission line elements. This means for effecting an open circuit impedance at $f_o$ in the bias circuit may again be implemented by appropriately connected quarter wavelength transmission line elements at the fundamental frequency $f_o$.

In a preferred embodiment of the present invention, the transistor may comprise a field effect transistor and the desired harmonic may be the second harmonic frequency $2f_o$.

DETAILED DESCRIPTION OF THE PREFERRED EMBODIMENT

Figure 1:
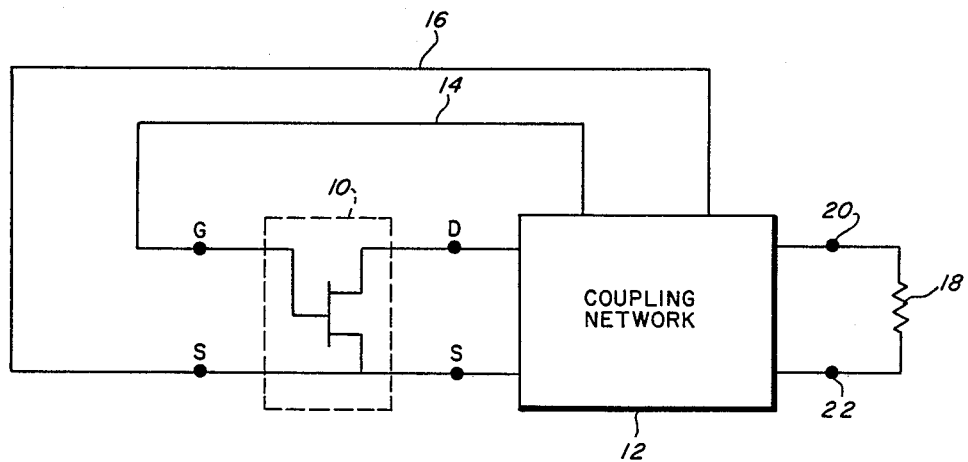
FIG. 1 is a general schematic diagram of a harmonic frequency oscillator.

The present invention is directed to self-oscillating harmonic frequency generators in which the transistor functions both as a fundamental frequency oscillator and a desired harmonic frequency generator. This type of circuit has the inherent ability to produce RF signal power at frequencies above those at which a given device would otherwise be considered for fundamental frequency oscillation. The intent in developing such a device is to use the device as an RF source in frequency ranges where the fundamental frequency oscillation becomes impractical either due to lack of device gain or due to tuning considerations. The frequency multiplication operation of the present circuit relies specifically on nonlinear transistor behavior as the basic operating mechanism. Consequently, device-circuit interaction not only at the fundamental frequency, but also at the harmonic frequencies, is very crucial to the multiplication process.

The present invention will be described in the context of a field-effect transistor with the second harmonic selected as the harmonic of interest. It should, of course, be noted that the present invention is in no way limited to FET implementations. Likewise, the present invention may be utilized at a variety of harmonics.

The efficient use of the second harmonic frequency, i.e. frequency doubling, requires circuit elements with pronounced nonlinear characteristics for inflicting on an incoming fundamental frequency signal as much asymmetrical waveform distortion as possible while minimizing parasitic losses. In this regard, GaAs FET's appear particularly attractive due to their quadratic-type nonlinearities and their overall conversion gain, broadband operation, and isolation between the input and the output.

In order to effect frequency multiplication in a GaAs FET, either the nonlinear input capacitance, the nonlinear intrinsic drain-source resistance, and/or the nonlinear transconductance could be utilized in principle. However, according to large-signal simulations performed, the first two alternatives appear unattractive due to associated transistor parasitic losses. Accordingly, the preferred mode in the present invention for obtaining frequency multiplication is to modulate the transconductance. Such a transconductance modulation can be accomplished by using the FET as a half-wave rectifier. This can be implemented by operating the transistor either in the vicinity of forward conduction or in the vicinity of pinch-off. Measurements performed on a preliminary breadboard doubler circuit indicate that the two alternatives for half-wave rectification are roughly equivalent regarding the fundamental to second harmonic frequency conversion efficiency. However, operating in the vicinity of forward conduction requires high DC drain current and thus lower DC-to-RF efficiencies as well as higher risk of device failure due to elevated gate current spikes. Thus, the present design is implemented utilizing an FET operating in the vicinity of pinch-off.

For the present second harmonic example, it is desired to extract signal power only at the frequency $2f_o$. In order to obtain maximum efficiency of signal power conversion, optimum matching conditions for the input and the output of the transistor at $f_o$ and $2f_o$ are required, as well as the implementation of optimum feedback conditions independently at the frequencies $f_o$ and $2f_o$. The present design is directed specifically at satisfying all of these conditions simultaneously with a coupling network which has sufficient flexibility to permit full exploitation of transistor performance capabilities.

In the present instance, the crux of the problem is not only to bias the transistor and establish $f_o$ feedback for maximum generation of the second harmonic signal power available at the transistor output port, but also to insure that maximum harmonic power is delivered to the load attached to the terminals of the transistor. Specifically, it has been discovered that the DC-to-RF efficiency of the oscillator circuit depends to a significant extent on the amount and phase of harmonic signal which is fed back to the transistor input port. In particular, it has been discovered that for certain frequency harmonics this harmonic feedback signal back to the input port of the transistor can lead to destructive interaction with the harmonic signal at the output port of the transistor. Analysis has shown that this destructive interaction between the harmonic frequency feedback signal and the output-generated harmonic signal can be quite significant. The present invention thus sets forth a design for providing the necessary flexibility for exercising control over the feedback at the harmonic frequency to the input port of the transistor.

Referring now to the drawings, wherein like reference characters designate like or corresponding parts throughout the views, FIG. 1 shows a block diagram of the overall frequency multiplier circuit. A transistor 10, which is shown in the drawing as a field-effect transistor, includes the terminals G, D, S. A coupling network 12 is disposed across the terminals G, D and S in order to control transistor terminating impedances and feedback both at the fundamental frequency $f_o$ and the desired harmonic frequency, in this case $2f_o$. The feedback is represented by the lines 14 and 16 from the coupling network 12 back to the transistor input port comprised of terminals G and S. A load 18 is coupled to another set of terminals eminating from the coupling network 12. In operation, the transistor 10 is made to oscillate at the fundamental frequency $f_o$ by feeding $f_o$ signal power leaving the output port (comprising the terminals D-S of the transistor) back to the input port (comprising the terminals G-S) with the proper phase and amplitude. The coupling network 12 is designed so that no power at the fundamental frequency $f_o$ flows through the load port (terminals 20 and 22). The coupling network 12 is responsible for achieving the proper $f_o$ impedance matching conditions at the ports D-S and G-S, as well as providing the required $f_o$ phase shift.

The transistor 10 is biased so that it operates at a point where its transconductance exhibits large quadratic nonlinearity, but still maintains enough gain to support oscillation at $f_o$. For a GaAs FET, this bias point is typically at a small-signal drain current of about 1/10th of the drain current at 0 gate voltage ($I_{dss}$).

As noted previously, the coupling network 12 is specifically designed to control the feedback of the harmonic signal from the output port D-S of the transistor 10 to the input port G-S. For the specific example to be set forth in FIG. 2, the coupling network 12 is designed to essentially prevent feedback at the desired harmonic from the output port D-S to the input port G-S in order to prevent the destructive interaction at the transistor output port D-S between the harmonic signal fed back to the output via the transistor input, and the harmonic signal generated at the output port D-S.

Figure 2:
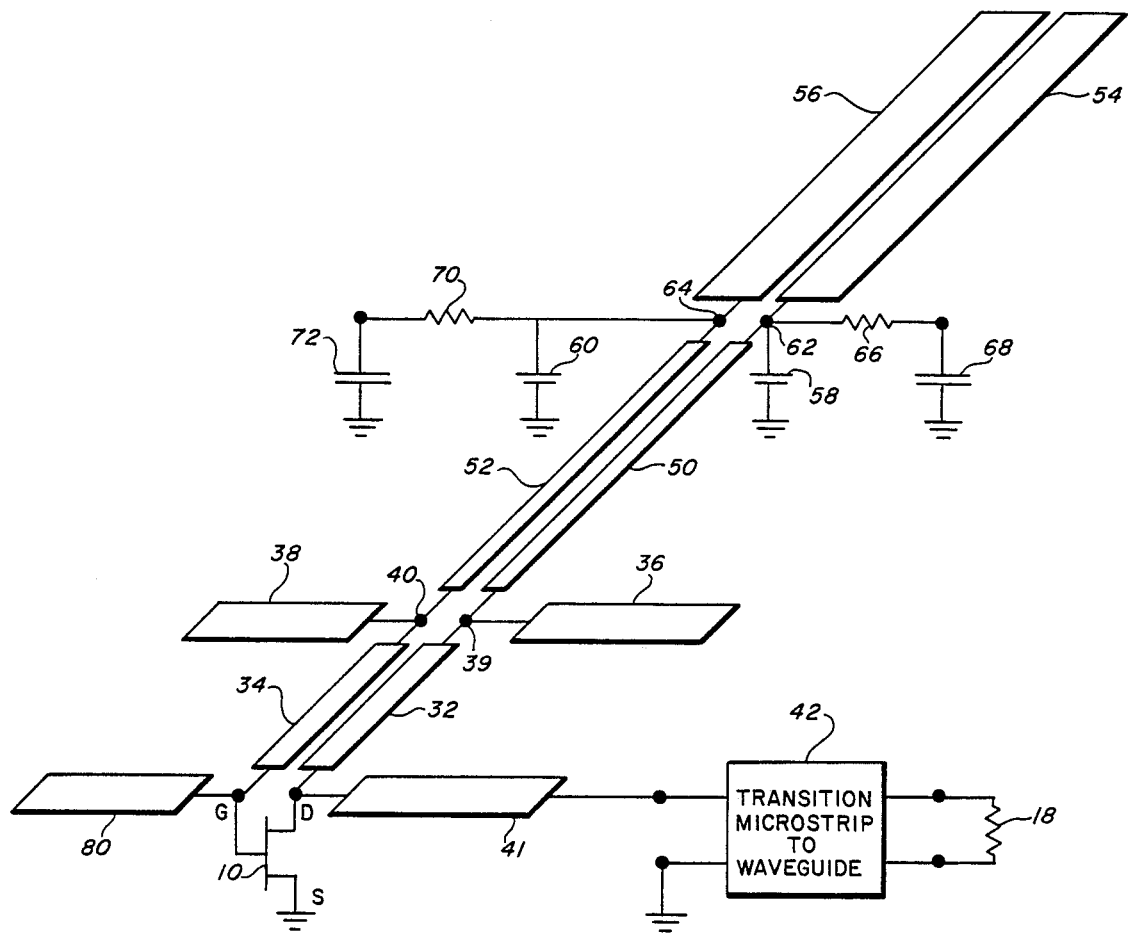
FIG. 2 is a schematic circuit diagram of a preferred embodiment of the present invention.

Referring now to FIG. 2, there is shown a schematic circuit diagram of a frequency doubler including a coupling network for permitting feedback at the fundamental frequency $f_o$ while preventing feedback at the second harmonic frequency $2f_o$. The circuit comprises the transistor 10; a coupling network comprising the transmission line elements 32, 34, 36, and 38; a circuit for coupling the desired harmonic frequency from the output port D-S to a load and comprising the transmission line 41 and the transition microstrip to waveguide block 42; and a biasing circuit for supplying the appropriate voltages to the transistor terminals comprising the transmission lines 50, 52, 54, and 56 in combination with voltage sources 58 and 60.

The coupling network in the present embodiment is designed to permit the feedback of the fundamental frequency $f_o$ while preventing the feedback of the second harmonic frequency $2f_o$ to the input port G-S. The coupling network comprises a first transmission line element 32 a quarter wavelength long at the second harmonic frequency $2f_o$ connected at a first end thereof to the port D-S of the transistor 10. A second transmission line element 34 which is a quarter wavelength long at the second harmonic frequency is connected at its first end to the port G-S. A third transmission line element 36 which is a quarter wavelength long at the second harmonic frequency is connected at its first end to the second end of the transmission line 32, i.e. the terminal 39. The second end of the third transmission element 36 is an open circuit. A fourth transmission line element 38 which is a quarter wavelength long at the second harmonic is likewise connected at its first end to the second end of the second transmission line element 34, i.e. at the terminal 40. The second end of this fourth transmission line element 38 is again an open circuit.

The transmission line elements 32, 34, 36, and 38 may be implemented by microstrip lines. The transmission line elements 32 and 34 are disposed in a parallel relationship to each other in order to form a pair of microstrip coupled lines. In a pair of microstrip coupled lines, as the energy propagates down one of the lines, it couples into the parallel line by means of induced currents. This pair of microstrip coupled lines 32 and 34 effect the feedback of the fundamental frequency $f_o$ from the port D-S to the port G-S in order to cause the transistor to oscillate at the fundamental frequency $f_o$. The characteristic impedances for the lines 32, 34, 36, and 38 may be set using well known analysis in order to optimize to a desired $f_o$ feedback level and phase.

The purpose of making the second ends of the transmission line elements 36 and 38 open circuits and making the lengths of the transmission line elements 32, 34, 36, and 38 equal to a quarter wavelength at the second harmonic frequency $2f_o$ is to essentially cause the port G-S to see an open circuit at the second harmonic frequency. This can be understood as follows. The open circuit at the second end of the transmission line 36 is transformed into a short circuit a quarter wavelength of the frequency $2f_o$ away at the terminal 39. If an additional quarter wavelength is traversed through the transmission line element 32, the short circuit at the frequency $2f_o$ at the point 39 will be viewed at the port D-S as an open circuit. The identical analysis can be performed on the open circuit in the transmission line element 38. More specifically, the open circuit in the transmission line element 38 is converted to a short circuit at the second harmonic at the terminal 40, and into an open circuit after traversal of the quarter wavelength transmission line element 34. In addition, this structure also establishes an open circuit between both first ends of transmission lines 32 and 34, thereby effectively separating or isolating the D-S and G-S ports at the second harmonic. Accordingly, the second harmonic signal set up between the drain D and source S terminals is prevented from feeding back to the gate port of the transistor. Thus, potentially destructive interaction between the second harmonic signal fed back to the output via the input and the output-generated second harmonic at the drain-source port is essentially obviated.

Typically, the load 18 will be a microwave waveguide with appropriate dimensions so that its cutoff frequency is above the fundamental frequency $f_o$ but below the harmonic frequency of interest, i.e. the second harmonic in this case. The transition microstrip to waveguide block 42 may be simply a microwave probe disposed to project into the waveguide like an antenna to radiate therein. The microwave probe element 42 may be connected to the D-S port of the transistor 10 simply by a transmission line element 41. The characteristic impedance for the transmission line element 41 may be determined through standard circuit analysis. The microwave probe may take a variety of shapes and configurations. By way of example, the probe used to couple a second harmonic frequency equal to 30 GHz was comprised simply of a metal strip disposed on a dielectric backing with no copper cladding or ground plane. The particular probe used had a length of 0.08 inches and a width of 0.04 inches. The probe utilized was backshorted in the waveguide in order to insure that the second harmonic signal propagates in only one direction in the waveguide. The backshort in the waveguide is implemented simply by placing a reflecting surface in the waveguide one quarter wavelength at the second harmonic frequency away from the probe. This reflecting surface forms a short which will be seen as an open circuit a quarter wavelength away at the probe thereby preventing any signal propagation in the direction of the reflecting surface. The actual waveguide dimensions utilized in the present design for a second harmonic frequency of 30 GHz are 0.28 inches by 0.14 inches. Because the waveguide dimensions are specially chosen to ensure that the fundamental frequency is below the waveguide cutoff frequency, the probe appears as an open circuit to the fundamental with some stray capacitance.

As noted previously, the biasing circuit comprises the transmission lines 50, 52, 54, and 56 and the voltage sources 58 and 60. In order to ensure good signal conversion efficiency, it is important that energy at the fundamental frequency $f_o$ and at the second harmonic $2f_o$ are not dissipated in the biasing circuits. Additionally, the biasing circuit should not be connected into the transistor circuit at a place where it would disrupt the impedance thereof. The foregoing can be achieved by ensuring that either open circuits or short circuits or a combination thereof at the frequencies $f_o$ and $2f_o$ are present at the biasing circuit terminals. Accordingly, the biasing circuit is connected to the coupling network at the points 39 and 40 which see a short circuit at the frequency $2f_o$ due to the open circuits at the ends of the transmission line elements 36 and 38. Connection of the biasing circuit at these points ensures both that the biasing circuit does not disrupt the rest of the coupling network at $2f_o$ and that the second harmonic frequency $2f_o$ does not propagate in the biasing circuit. The biasing circuit itself is designed in order to present an open circuit at the frequency $f_o$ at the points 39 and 40 thereby not disrupting the $f_o$ operation of the coupling network. This open circuit at the frequency $f_o$ is effected by connecting a fifth transmission line element 50 with a length of a quarter wavelength at the fundamental frequency $f_o$ with its first end connected to the terminal 39. A sixth transmission line element 54 with a length of a quarter wavelength at the fundamental frequency $f_o$ is connected with its first end connected to the second end of the transmission line element 50 at the point 62. The second end of the transmission line element 54 is an open circuit. A seventh transmission line element 52 with a length of a quarter wavelength at the fundamental frequency $f_o$ is connected at a first end thereof to the terminal 40. An eighth transmission line element 56 having a length of a quarter wavelength at the fundamental frequency $f_o$ is connected at its first end to the second end of transmission line element 52 at the terminal 64. The second end of the transmission line element 56 is an open circuit. Using the previous analysis it can be seen that the open circuited end of the transmission line 54 will be viewed a quarter wavelength away at the terminal 62 as a short circuit at the frequency $f_o$. The short circuit at the frequency $f_o$ at the terminal 62 will be viewed a quarter wavelength away at the point 39 as an open circuit at the frequency $f_o$. Likewise, the open circuited end of the transmission element 56 will be viewed a quarter wavelength away at the terminal 64 as a short circuit at the frequency $f_o$. This short circuit at the frequency $f_o$ at the terminal 64 will again be viewed an additional quarter wavelength away at the terminal 40 as an open circuit at the frequency $f_o$. Thus, the bias circuit presents open circuits at the frequency $f_o$ between terminals 39 and ground and terminal 40 and ground. With terminals 39 and 40 short-circuited to ground at the frequency $2f_o$ the frequencies $f_o$ and $2f_o$ cannot propagate in the biasing circuit. The actual voltage sources 58 and 60 for the biasing circuit are connected into the circuit at the terminals 62 and 64, respectively.

In a preferred embodiment, circuitry may be added to the biasing circuit to suppress potential out-of-band oscillations. This suppression circuitry in FIG. 2 comprises a resistor 66-capacitor 68 combination connected to the terminal 62, and a resistor 70-capacitor 72 combination connected to the terminal 64. These two R-C circuits provide a dissipative path to ground for the D and G terminals for frequencies lower than the fundamental frequency $f_o$. Thus, low frequency spurious oscillations are suppressed. In essence, the D-S port is loaded with the resistor 66-capacitor 68 circuit at low frequencies below the fundamental, thereby killing the gain of the transistor at the low frequency end of the spectrum. Likewise, the port G-S is loaded with the resistor 70-capacitor 72 circuit at low frequencies below the fundamental for the same purpose.

An additional transmission line element 80 is connected directly to the G port of the transistor for the purpose of providing optimum loading at the second harmonic frequency. In the embodiment shown in FIG. 2, this transmission line element 80 has a length of a quarter wavelength at the second harmonic frequency and is open-circuited at its end. Thus, this transmission line element 80 provides a short circuit at the frequency $2f_o$ at the port G-S.

By way of example, and not by way of limitation, the following transmission line element values may be utilized. In this example, an Avantek GaAs FET, type M 106 was utilized as the transistor 10. This FET had a gate length of 0.5 μm, a gate width of 250 μm, with a gate-source voltage of $-1.2$ V, a drain-source voltage of $+3.0$ V, relative to a pinch-off voltage of $-1.5$ V. The circuit element parameters are listed below:

CP32-34: $Z_{oe}=128\Omega$, $Z_{oo}=62.5\Omega$, $\theta=90°$ at 30 GHz
TRL38: $Z_o=87\Omega$, $\theta=90°$ at 30 GHz
TRL36: $Z_o=50\Omega$, $\theta=90°$ at 30 GHz
TRL80: $Z_o=130\Omega$, $\theta=90°$ at 30 GHz
TRL41: $Z_o=50\Omega$, $\theta=123°$ at 30 GHz
TRL50-52: $Z_o=120\Omega$, $\theta=90°$ at 15 GHz
TRL54-56: $Z_o=42\Omega$, $\theta=90°$ at 15 GHz
R66-70: 50 Ω
C68-72: 20 pF
Waveguide: WR28

The actual circuit may be realized in microstrip on a 0.25 mm glass-fiber-reinforced dielectric Teflon substrate with a ground plane disposed on the other side.

Figure 3:
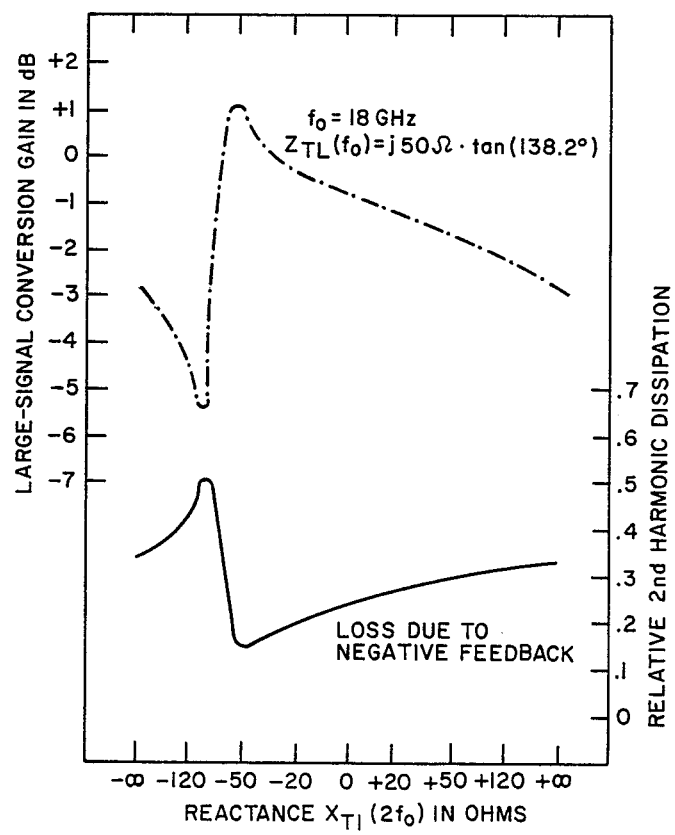
FIG. 3 is a graph illustrating the large-signal conversion gain plotted against the second harmonic input reactance in the top curve with the bottom graph comprising a curve of the second harmonic dissipation versus the reactance.

FIG. 3 shows the projected large-signal conversion gain for a similar (but non self-oscillating) circuit plotted against reactance in the upper dashed curve. The solid-line curve shows the fraction of power lost due to the second harmonic feed via the input back to the intrinsic device output, thereby giving rise to destructive interference. The large dip in the conversion gain is caused primarily by the second harmonic feedback losses as can be readily seen from the juxtaposition of the two curves.

Figure 4:
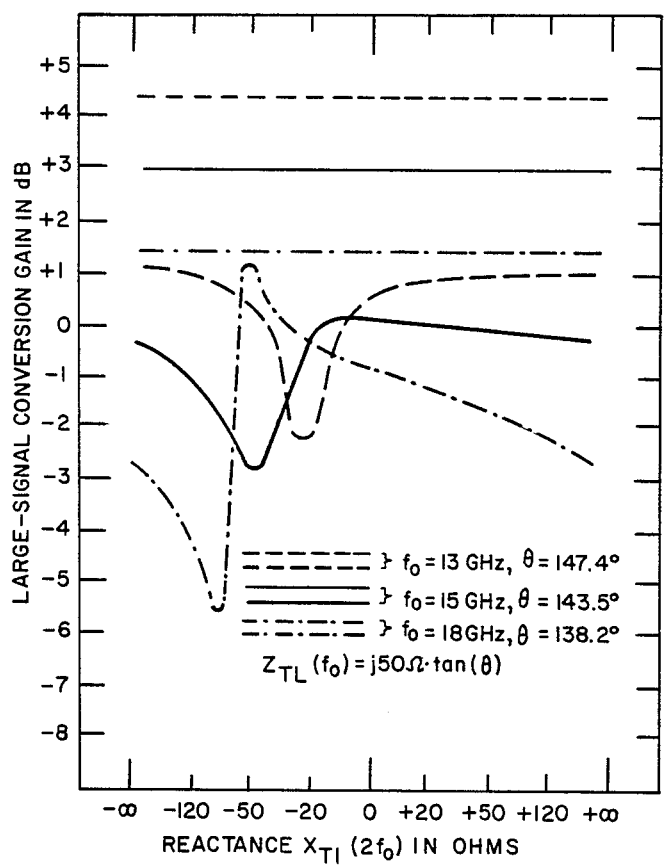
FIG. 4 shows curves of the large-signal conversion efficiency as a function of frequency and the second harmonic input termination reactance.

FIG. 4 again sets forth curves comparing a circuit having typical parasitic $2f_o$ feedback against a coupling circuit similar to that of the present invention but non self-oscillating. The lower three curves illustrated in FIG. 4 show the large-signal conversion efficiency as a function of frequency and the second harmonic input termination reactance. Simulations run on this circuit show that the pronounced dips are due largely to the second harmonic feedback via the input to the transistor output port and the attendant destructive interference therefrom. The upper three curves indicate the transistor doubler performance with the second harmonic feedback cancelled.

As noted previously, the present design is directed not only to biasing the transistor to establish the $f_o$ feedback for maximum generation of the second harmonic signal power available at the transistor output port (D-S), but also to ensure that the maximum harmonic power is delivered to the load. The present invention is based on the fact that the harmonic signal fed back to the transistor input (G-S) and transmitted through the transistor to its output (D-S) can lead to destructive interaction with a corresponding reduction in DC-to-RF efficiency of the overall circuit. Accordingly, the present circuit includes a coupling network which provides the necessary design flexibility to specifically exercise control over feedback at the harmonic frequency. This circuit design provides enough degrees of freedom to allow the independent choice of loading conditions at the fundamental frequency $f_o$ and the desired harmonic, in this case $2f_o$, both at the input and the output and the feedback at those frequencies.

Utilizing the circuit element values set forth above in the present circuit design yields a significantly improved DC-to-RF efficiency of 10% for the overall circuit for a 30 GHz output signal harmonic.

It should be noted that there are a variety of design options that come within the scope of the present invention. By way of example, the transistor utilized does not need to be GaAs FET transistor. Any other type of transistor may be utilized, including a bipolar transistor. Additionally, dual-gate transistors such as the dual-gate GaAs FET may be utilized provided that the dual-gate device is operating in a mode that permits it to be conceived as a cascade connection of two single-gate transistors, with one of them, in essence, engaged in linear amplification.

If a bipolar transistor is utilized, then the FET drain terminal would coincide with the collector terminal, the source terminal with the emitter terminal, and the gate terminal with the base terminal.

The particular circuit element parameters to be used for any given design utilizing the present principles may be effected in accordance with the discussion set forth in the paper "High-Frequency Doubler Operation of GaAs Field-Effect Transistors" by Christen Rauscher, IEEE Trans. Microwave Theory Techniques.

The present inventive concept includes filter-type coupling networks which allow the independent control of the transistor matching conditions and the feedback conditions at both $f_o$ and a desired harmonic, such as $2f_o$. Balanced circuits using the foregoing principles and involving two or more transistors also come within the scope of the present invention.

The circuit set forth in FIG. 2 was designed specifically to prevent feedback from the drain terminal to the gate terminal of the transistor at the second harmonic frequency. However, there may be instances where feedback at the second harmonic of a lower fundamental frequency with a different transistor may actually be beneficial. Accordingly, the transmission line configuration including the transmission line elements 32, 34, 36, and 38 could be changed to have different lengths and characteristic impedances to provide a specific controlled feedback at the desired harmonic. However, the fundamental principle of controlling the second harmonic feedback independently of the fundamental frequency feedback is the same.

If additional degrees of design freedom are required, series capacitors or inductors may be added to the circuit. By way of example, a capacitor or an inductor may be inserted between the gate terminal and the transmission line element 34 or between the drain terminal and the transmission line element 32 to provide an additional design option. In essence, the present circuit structure may be augmented with additional series or shunt elements to accommodate different transistors or design requirements.

It should be noted that the transmission line element 80 may not be necessary if a different transistor is utilized or a different fundamental frequency is used.

It should also be noted that the biasing circuitry including the voltage sources 58 and 60 and the transmission line elements 50, 52, 54 and 56 could be connected at another point in the circuit. The elements 50, 52, 54, and 56 act to prevent the dissipation of signal energy at the fundamental frequency in the biasing circuit. However, provision would have to be made in order to prevent dissipation of the second harmonic frequency in the biasing circuit.

In essence, the present invention provides a circuit design for obtaining maximum power at a desired harmonic frequency for minimum power supplied by the DC biasing circuit. DC-to-RF efficiencies of 10% were obtained at Ka-band with a circuit employing commonly available half-micron transistors.

Obviously any modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An oscillator circuit for generating power at a desired harmonic frequency comprising:
   a transistor with a B, a C, and an E terminals which form ports C-E and B-E;
   a coupling network connected to said B, C, and E terminals and including a first circuit for providing feedback at a fundamental frequency $f_o$ from said C-E port to said B-E port in order to make said transistor oscillate at said frequency $f_o$, and a second circuit connected to and operating in conjunction with said first circuit for providing isolation between ports C-E and B-E at the desired harmonic frequency of $f_o$ to thereby prevent coupling at the harmonic frequency;
   a bias circuit for supplying appropriate voltages to said transistor terminals to effect biasing thereof; and means for coupling the desired harmonic from said port C-E to a load.

2. An oscillator as defined in claim 1, wherein said first circuit of said coupling network comprises:
first and second electromagnetically coupled transmission line elements for providing the feedback at the fundamental frequency $f_o$, both of the first and second line elements being a quarter wavelength long at the desired harmonic frequency and both having a first and a second ends, said first transmission line element having its first end connected to the C-E port, said second transmission line having its first end connected to the B-E port; and
wherein said second circuit of said coupling network comprises:
a third and fourth transmission line elements each a quarter wavelength long at the desired harmonic frequency and each having a first and a second ends, said third transmission line element having its first end connected to the second end of said first transmission line element and with the second end of the third transmission line element being an open circuit, said fourth transmission line element havings its first end connected to the second end of said second transmission line element and with the second end of said fourth transmission line element being an open circuit.

3. An oscillator as defined in claim 2, wherein said bias circuit is connected across the second ends of said first and second transmission line elements; and wherein said bias circuit further comprises means for effecting an open circuit driving point impedance at the fundamental frequency $f_o$ relative to the bias circuit terminals connected to the second ends of said first and second transmission line elements.

4. An oscillator as defined in claim 3, wherein said open circuit effecting means at the frequency $f_o$ comprises:
a fifth transmission line element having a first and second ends and with a length of one quarter wavelength at the fundamental frequency $f_o$, said fifth transmission line element connected at its first end to said second end of said first transmission line element;
a sixth transmission line element having a first and second ends and with a length of one quarter wavelength at the fundamental frequency $f_o$, said sixth transmission line element connected at its said first end to the second end of said fifth transmission line element, with the second end of the sixth transmission line element being an open circuit;
a seventh transmission line element having a first and second ends and with a length of one quarter wavelength at the fundamental frequency $f_o$, said seventh transmission line element connected at said first end thereof to said second end of said second transmission line element; and
an eighth transmission line element having a first and second ends and with a length of one quarter wavelength at the fundamental frequency $f_o$, said eighth transmission line element connected at said first end thereof to said second end of said seventh transmission line element, with the second end of the eighth transmission line element being an open circuit.

5. An oscillator as defined in claim 4, wherein said bias circuit further comprises means for suppressing out-of-band oscillations in said transistor.

6. An oscillator as defined in claim 5, wherein said first, second, third, and fourth transmission line elements are a quarter wavelength long at the second harmonic $2f_o$.

7. An oscillator as defined in claim 6, further comprising a ninth transmission line element having a first and second ends and a length of one quarter wavelength of the second harmonic frequency $2f_o$, said ninth transmission line element connected at said first end thereof to said B-E port of said transistor, with the second end of said ninth transmission line element being an open circuit.

8. An oscillator as defined in claim 7, wherein said bias circuit comprises a first source of voltage connected to the second end of said fifth transmission line element; and a second source of voltage connected to the second end of said seventh transmission line element.

9. An oscillator as defined in claim 8, wherein said oscillator suppressing means comprises a first resistor-capacitor network connected to the second end of said fifth transmission line element, and a second resistor-capacitor network connected to the second end of said seventh transmission line element.

10. An oscillator as defined in claim 9, wherein said load coupling means comprises:
a microwave probe projecting into a waveguide; and
a tenth transmission line element connecting said C terminal of said transistor to said microwave probe.

11. An oscillator/doubler circuit for generating power at a second harmonic frequency $2f_o$ comprising:
a transistor with a B, a C, and an E terminals which form ports C-E and B-E;
a coupling network connected to said B, C, and E terminals and including a first circuit for providing feedback at a fundamental frequency $f_o$ from said port C-E to said port B-E in order to make said transistor oscillate at the frequency $f_o$, and a second circuit connected to and operating in conjunction with said first circuit for providing essentially infinite impedance between said transistor terminals C and B at the second harmonic frequency $2f_o$ to thereby prevent coupling at this harmonic frequency;
a bias circuit for supplying appropriate voltages to said transistor terminals to effect biasing thereof, said biasing circuit being connected to supply said appropriate voltages through said first circuit of said circuit of said coupling network to said transistor C and B terminals, said biasing circuit including means for providing an effective open circuit impedance at the fundamental frequency $f_o$ at the point of the bias circuit connection to said first circuit; and
means for coupling the second harmonic $2f_o$ from the C terminal to a load.

12. An oscillator/doubler as defined in claim 11, wherein said first circuit of said coupling network comprises:
a first and second transmission line elements each a quarter wavelength long at the second harmonic frequency $2f_o$ and each having a first and a second ends, said first transmission line element having its first end connected connected to the C-E port, said second transmission line having its first end connected to the B-E port;
wherein said second circuit of said coupling network comprises
a third and fourth transmission line elements each a quarter wavelength long at the second harmonic frequency $2f_o$ and each having a first and a second ends, said third transmission line element having its first end connected to the second end of said first transmission line element and with the second end of the third transmission line element being an open circuit, said fourth transmission line element havings its first end connected to the second end of said second transmission line element and with the second end of said fourth transmission line element being an open circuit; and wherein said biasing circuit is connected to across the second ends of said first and second transmission line elements.

13. An oscillator/doubler as defined in claim 12, wherein said open circuit effecting means at the frequency $f_o$ comprises:

a fifth transmission line element having a first and second ends and with a length of one quarter wavelength at the fundamental frequency $f_o$, said fifth transmission line element connected at its first end to said second end of said first transmission line element;

a sixth transmission line element having a first and second ends and with a length of one quarter wavelength at the fundamental frequency $f_o$, said sixth transmission line element connected at its first end to the second end of said fifth transmission line element, with the second end of the sixth transmission line element being an open circuit;

a seventh transmission line element having a first and second ends and with a length of one quarter wavelength at the fundamental frequency $f_o$, said seventh transmission line element connected at a first end thereof to said second end of said second transmission line element; and an eight transmission line element having a first and second ends and with a length of one quarter wavelength at the fundamental frequency $f_o$, said eighth transmission line element connected at a first end thereof to a second end of said seventh transmission line element, with the second end of the eighth transmission line element being an open circuit.

14. An oscillator/doubler as defined in claim 13, wherein said transistor is a field effect transistor with the source being the E terminal, the drain being the C terminal, and the gate being the B terminal.

15. An oscillator/doubler as defined in claim 14, wherein said first, second, third, fourth, fifth, sixth, seventh and eighth transmission line elements are microstrip line elements.

16. An oscillator/doubler as defined in claim 15, wherein said bias circuit further comprises means for suppressing out-of-band oscillations in said transistor by providing a dissipative path to ground to such oscillations.

17. An oscillator/doubler as defined in claim 16, further comprising a ninth microstrip line element having a length of one quarter wavelength of the second harmonic frequency $2f_o$, said ninth microstrip line element connected at a first end thereof to said B-E port of said transistor, with the second end of said ninth transmission line element being an open circuit.

18. An oscillator/doubler circuit for generating power at a second harmonic frequency $2f_o$ comprising:

a field effect transistor (FET) with a G, a D, and an S terminals forming ports G-S and D-S;

a coupling network connected to said G, D, and S terminals including a first and a second electromagnetically coupled microstrip lines which are each a quarter wavelength long at the second harmonic frequency $2f_o$ and each having a first and second ends thereof, said first microstrip line having its first end connected to said D-S port, said second microstrip line having its first end connected to said G-S port, said coupling network further including a third microstrip line connected at one end thereof to the second end of said first microstrip line with its other end being an open circuit, and a fourth microstrip line connected at one end thereof to the second end of said second microstrip line with the other end of the fourth microstrip line being an open circuit, said third and fourth microstrip lines each being a quarter wavelength long at the second harmonic frequency $2f_o$; wherein energy at the fundamental frequency $f_o$ is coupled between port D-S and port G-S via said first and second microstrip lines to make said FET oscillate at the frequency $f_o$ while isolation is introduced between ports D-S and G-S at the second harmonic frequency $2f_o$;

a bias circuit for supplying appropriate voltages to said FET terminals to effect biasing thereof; and means for coupling the second harmonic frequency $2f_o$ from said port D-S to a waveguide.

19. An oscillator/doubler as defined in claim 18, wherein said bias circuit is connected by separate leads to the second end of said first microstrip line and the second end of said second microstrip line; and wherein said bias circuit further comprises means for effecting an open circuit driving impedance at the second ends of said first and second microstrip lines for the fundamental frequency $f_o$.

20. An oscillator/doubler as defined in claim 19, wherein said bias circuit further comprises means for suppressing out-of-band oscillations in said FET.

21. An oscillator/doubler as defined in claim 20, wherein said open circuit effecting means at the frequency $f_o$ comprises:

a fifth microstrip line element having a first and second ends and with a length of one quarter wavelength at the fundamental frequency $f_o$, said fifth microstrip line connected at its first end to said second end of said first microstrip line element;

a sixth microstrip line element having a first and second ends and with a length of one quarter wavelength at the fundamental frequency $f_o$, said sixth microstrip line connected at its first end to the second end of said fifth microstrip line element, with the second end of the sixth microstrip line element being an open circuit;

a seventh microstrip line element having a first and second ends and with a length of one quarter wavelength at the fundamental frequency $f_o$, said seventh microstrip line element connected at a first end thereof to said second end of said second microstrip line element; and an eighth microstrip line element having a first and second ends and with a length of one quarter wavelength at the fundamental frequency $f_o$, said eighth microstrip line element connected at a first end thereof to a second end of said seventh microstrip line element, with the second end of the eighth microstrip line element being an open circuit.

22. An oscillator/doubler as defined in claim 19, wherein said open circuit effecting means at the frequency $f_o$ comprises:

a fifth microstrip line element having a first and second ends and with a length of one quarter wavelength at the fundamental frequency $f_o$, said fifth microstrip line connected at its first end to said second end of said first microstrip line element;

a sixth microstrip line element having a first and second ends and with a length of one quarter wavelength at the fundamental frequency $f_o$, said sixth microstrip line connected at its first end to the second end of said fifth microstrip line element, with the second end of the sixth microstrip line element being an open circuit;

a seventh microstrip line element having a first and second ends and with a length of one quarter wavelength at the fundamental frequency $f_o$, said seventh microstrip line element connected at a first end thereof to said second end of said second microstrip line element; and an eighth microstrip line element having a first and second ends and with a length of one quarter wavelength at the fundamental frequency $f_o$, said eighth microstrip line element connected at a first end thereof to a second end of said seventh microstrip line element, with the second end of the eighth microstrip line element being an open circuit.

23. An oscillator/doubler as defined in claim 21, further comprising a ninth microstrip line having a length of one quarter wavelength of the second harmonic frequency $2f_o$, said ninth microstrip line connected at a first end thereof to said G terminal of said FET, with the second end of said ninth microstrip line being an open circuit.

24. An oscillator/doubler as defined in claim 23, wherein said bias circuit comprises a first source of voltage connected to the second end of said fifth microstrip line; and a second source of voltage connected to the second end of said seventh microstrip line.

25. An oscillator/doubler as defined in claim 24, wherein said oscillation suppressing means comprises a first resistor-capacitor network connected to the second end of said fifth microstrip line, and a second resistor-capacitor network connected to the second end of said seventh microstrip line.

26. An oscillator/doubler as defined in claim 25, wherein said waveguide coupling means comprises:

a microwave probe projecting into said waveguide; and a tenth microstrip line connecting said D-S port of said FET to said microwave probe.

* * * * *